United States Patent
Watanabe et al.

[11] Patent Number: 5,839,914
[45] Date of Patent: Nov. 24, 1998

[54] CONNECTOR FOR DETECTING INCOMPLETE INSERTION OF TERMINAL

[75] Inventors: Tamio Watanabe; Toru Nagano; Sakai Yagi, all of Shizuoka, Japan

[73] Assignee: Yazaki Corporation, Tokyo, Japan

[21] Appl. No.: 649,204

[22] Filed: May 17, 1996

[30] Foreign Application Priority Data

May 22, 1995 [JP] Japan ................................. 7-122498

[51] Int. Cl.$^6$ ........................................ H01R 3/00
[52] U.S. Cl. ..................... 439/488; 439/595; 439/752.5
[58] Field of Search .................... 439/595, 752.5, 439/488, 489; 324/537, 538, 761

[56] References Cited

U.S. PATENT DOCUMENTS

| | | | |
|---|---|---|---|
| 5,378,170 | 1/1995 | Abe et al. | 439/752.5 X |
| 5,455,515 | 10/1995 | Sato et al. | 439/488 X |
| 5,512,833 | 4/1996 | Fukuda et al. | 439/489 X |
| 5,554,052 | 9/1996 | Sato et al. | 439/595 |

FOREIGN PATENT DOCUMENTS 62-47093  12/1987  Japan .
1-36149   11/1989  Japan .
7-113836   5/1995  Japan .

*Primary Examiner*—Khiem Nguyen
*Attorney, Agent, or Firm*—Armstrong, Westerman, Hattori, McLeland & Naughton

[57] ABSTRACT

A connector for detecting an incomplete insertion of a terminal is provided, wherein the connector causes a detecting accuracy of the incomplete insertion of the terminal to be improved when each of a detection of incomplete insertion and a detection of continuity of the terminal is performed. A guide groove is formed, into which an incomplete insertion detecting finger of an inspecting pin is inserted. The guide groove is formed at a space into which a resilient supporting piece is capable of bending when confronted by a terminal receiving chamber of a connector housing. A pick-up surface is provided for guiding at an opening of the guide groove. A straight portion is formed along the guide groove so as to protrude from the straight portion, which is lengthened at the tip of the resilient supporting piece. The straight portion is located a small distance apart from the guide groove in a direction toward the direction opposite of which the resilient supporting piece is capable of bending into.

4 Claims, 5 Drawing Sheets

CONNECTOR FOR DETECTING INCOMPLETE INSERTION OF TERMINAL

BACKGROUND OF THE INVENTION

1. Field of the Invention

The present invention generally relates to a connector for detecting incomplete insertion of a terminal and more particularly, to a connector for detecting incomplete terminal insertion, wherein the detecting accuracy of the incomplete insertion of a terminal is improved, when each of the detection of incomplete insertion and the detection of continuity of the terminal is performed by means of a connector checking device.

2. Description of the Related Art

FIG. 9 shows a conventional connector checking device for detecting the continuity of a terminal of a connector as disclosed in Japanese Patent Application Laid-Open No. 7-113836 (hereinafter JP '836).

According to JP '836, the connector checking device 41 includes a checking device main body 43, which moves back and forth by means of an operation lever 42, and a connector support 45 having a connector receiving chamber 44 which is located opposite of the checking device main body 43. The connector support 45 is urged toward the checking device main body 43 by a coil spring 47 attached to guide shafts 46. The connector support 45 retreats against the coil springs 47 when pressurized by the checking device main body 43. A connector 48 is inserted into the connector support 45 from an upper side of the connector support 45.

As shown in FIG. 10, a plurality of checking terminals 49 are provided for the checking, device main body 43. Further, detecting pins 50 are slidably mounted in the checking terminals 49, and the detecting pins 50 are urged by coil springs 51 to project into a checking chamber 52.

At a tip of the shaft portion 53 of the detecting pin 50, a detecting piece 54 is provided. The detecting piece 54 has a conductive contact face 54a and an incomplete insertion detecting finger 55, which projects forwardly from the detecting piece 54. Referring to FIG. 9, each detecting terminal 59 is connected to a continuity checking device (not shown) with a lead wire 60. The incomplete insertion detecting finger 55 is inserted into a space into which a resilient supporting piece 57 of a connector housing 56 is capable of bending, when a terminal 59 is incompletely inserted. As the detecting finger 55 of the detecting pin 50 for the terminal 59 abuts an end of the resilient supporting piece $57_1$, the detecting finger 55 of the detecting pin 50 is prevented from entering the space 58 so that the terminal 59 cannot come into contact with the contact face 54a. As a result, the detecting electrical circuit is opened so that the continuity checking device verifies that the connection of the terminal 59 is incomplete.

However, as shown in FIG. 11, the above-described conventional continuity inspection for the connector 48, the continuity inspection for the terminal 59 may not be able to be performed because an incomplete insertion detecting finger 55 of the detecting pin 50 comes into contact with the tip of the resilient supporting piece 57. This is especially true where the connector 48 is set so as to be in an inclined condition caused by looseness between the connector 48 itself and the connector receiving chamber 44 within the connector support 45 or where a settling is naturally generated on the resilient supporting piece 57 in spite of the terminal 59 being inserted into its regular position.

SUMMARY OF THE INVENTION

In view of the foregoing, it is an object of the present invention to provide a connector for detecting an incomplete insertion of a terminal which can accurately achieve both an incomplete insertion inspection and a continuity inspection for the terminal, even when the connector is placed in the connector checking device so as to be in an inclined condition.

According to one aspect of the present invention, for achieving the above-mentioned object, a connector for detecting the incomplete insertion of a terminal is provided. The connector for detecting incomplete insertion of a terminal has a guide groove into which an incomplete insertion detecting finger of an inspecting pin is inserted. The guide groove is formed at a space into which a resilient supporting piece is capable of bending when confronted by a terminal receiving cavity of a connector housing. The guide groove is also formed with a pick-up surface for guiding the incomplete insertion detecting finger formed at an opening of the guide groove.

According to another aspect of the present invention, a connector for detecting incomplete insertion of a terminal is provided, wherein the connector has a guide groove provided for a construction in which the inspecting pin with a continuity detecting portion at a base side of the incomplete insertion detecting finger. The incomplete insertion detecting finger is inserted into a space into which the resilient supporting piece is capable of bending. At the same time, the continuity detecting portion comes into contact with a terminal of the terminal receiving cavity. A straight portion along the guide groove is formed so as to protrude from a straight portion lengthened at the tip of the resilient supporting piece. The straight portion along the guide groove is located a small distance apart from the guide groove, toward a direction opposite to the direction into which the resilient supporting piece is capable of bending.

As stated above, the connector for detecting incomplete insertion of the terminal according to the present invention is provided with a guide groove so that the incomplete insertion detecting finger of the inspecting pin is inserted into the specified portion in the connector housing along the track of the guide groove. The pick-up surface of the opening portion of the guide groove causes the incomplete insertion detecting finger to be surely and certainly guided into the guide groove, even if the connector is inclined. The straight portion at the pointed end direction of the resilient supporting piece comes into contact with the incomplete insertion detecting finger at a sufficient distance ahead of the incomplete insertion detecting finger so that, at the time of incomplete insertion yielding, a distance between the continuity detecting portion of the inspecting pin and the terminal is enough to prevent a continuity detecting error. Furthermore, the straight portion is located a small distance apart from the guide groove, toward a direction opposite to the direction in which the resilient supporting piece is capable of bending so that the tip of the resilient supporting piece is prevented from miscontacting the incomplete insertion detecting finger (the incomplete insertion detecting finger being associated with a permanent set in fatigue of the resilient supporting piece).

The above-described and further objects and novel features of the present invention will be more fully understood from the following detailed description when the detailed description is read in connection with the accompanying drawing figures. It should be expressly understood, however, that the drawing figures are for the purpose of illustration only and are not intended as a definition of the limits of the present invention.

BRIEF DESCRIPTION OF THE DRAWING FIGURES

DETAILED DESCRIPTION OF THE PREFERRED EMBODIMENTS

A preferred embodiment of the present invention will now be described in detail referring to the accompanying drawing figures.

FIGS. 1–4 show a first embodiment of a connector for detecting incomplete insertion of a terminal according to the present invention.

Figure 1:
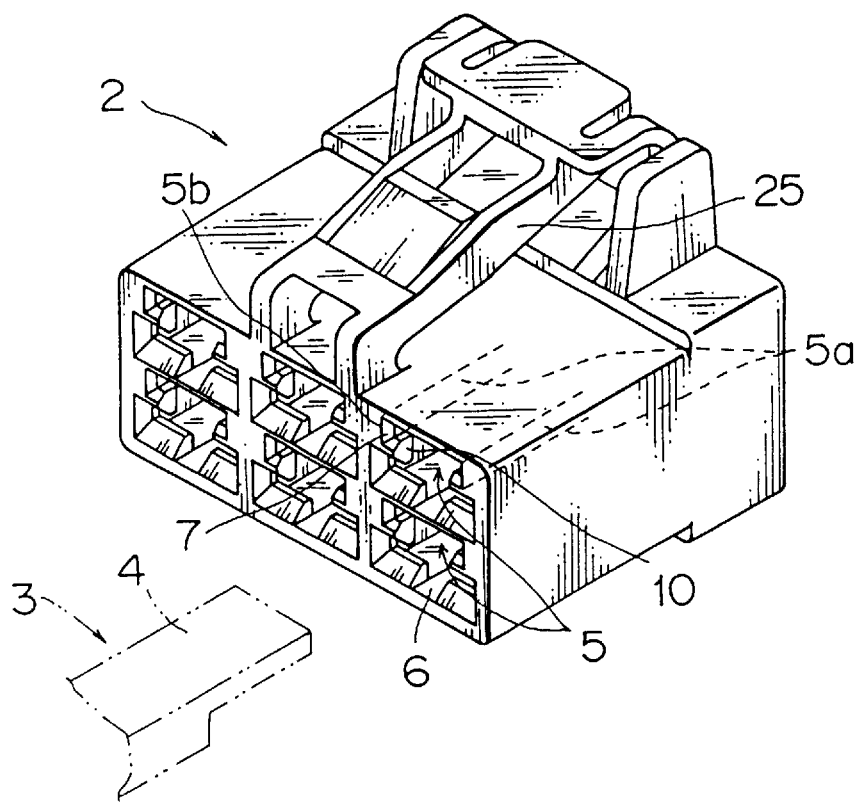
FIG. 1 is a perspective view showing a male connector housing as a first embodiment of a connector for detecting incomplete insertion of a terminal according to the present invention.
Figure 2:
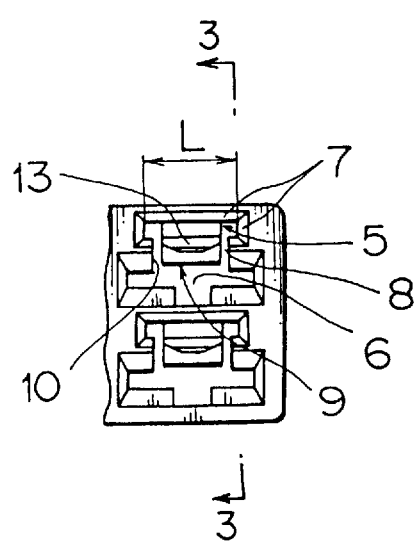
FIG. 2 is an partial front elevational view showing a principal portion of the male connector housing of the first embodiment of a connector for detecting incomplete insertion of a terminal according to the present invention.
Figure 3:
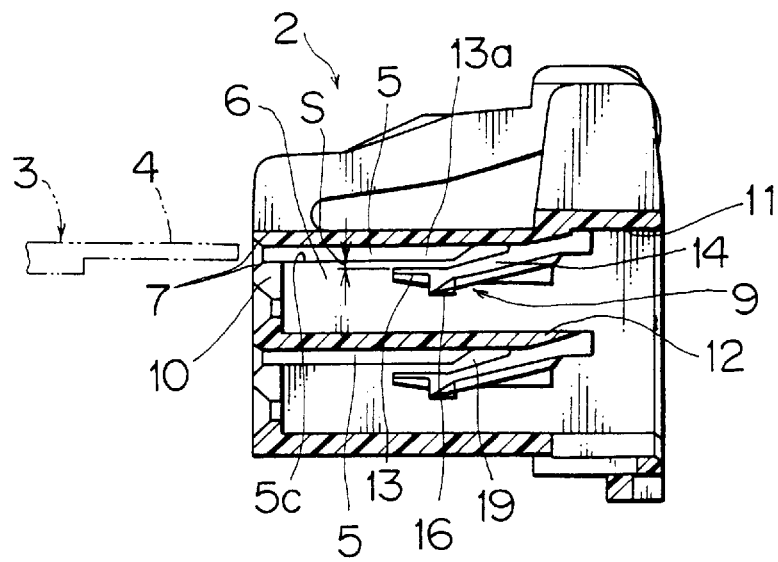
FIG. 3 is a longitudinal cross-sectional view along line A—A of FIG. 2.

As shown in FIGS. 1–3, the first embodiment relates to a male connector 1. A plurality of guide grooves 5, which correspond to each of terminal receiving chambers 6, respectively, are formed for insertion of an incomplete insertion detecting finger 4 of a detecting pin 3 into a male connector housing 2. The male connector housing 2 is made of synthetic resins as are the above-described prior art connector housings.

As shown in FIG. 1, the guide groove 5 is a rectangular notch formed through the front end of the connector housing 2. The guide groove 5 has concave grooves 5a on opposite right- and left-hand sides of the guide groove 5 so as to be on or over the terminal receiving chamber 6. The concave grooves 5a extend straight in the longitudinal direction (i.e., connector engaging direction). The guide groove 5 is formed so as to extend straight along the length of the range of the stroke of the detecting pin 3.

As shown in FIGS. 1–3, a tapered pick-up surface 7 for guiding the detecting pin 3 is formed either sideways or up-and-down at an opening portion 5b of the guide groove 5. Protuberances 10, for stopping terminals 15, 15$_1$, are provided on opposite to right- and left-hand sides of the opening portion 5b. The guide groove 5 is open at the upper side of the protuberances 10 which can serve as a guide to the incomplete insertion detecting finger 4. The concave groove 5a is formed as a notch through both side walls of the guide groove 5 over the terminal receiving chamber 6.

As shown in FIG. 2, the guide groove 5 is in communication with the terminal receiving chamber 6 through a communicating space 8 which is narrower than the width L of the guide groove 5. The communicating space 8 forms a part of the terminal receiving chamber 6. As shown in FIGS. 2 and 3, the resilient supporting piece 9 is situated in the periphery of the communicating space 8. The resilient supporting piece 9 is formed so as to protrude at an oblique angle either from a little in front of to a little to the rear end of the housing upper wall 11 or from an intermediate bulkhead 12. The resilient supporting piece 9 has a straight portion 13 which protrusively extends toward the longitudinal direction (i.e., ahead) so as to be parallel to the guide groove 5 on the tip thereof. The straight portion 13 has an upwardly-facing straight surface 13a.

Figure 4:
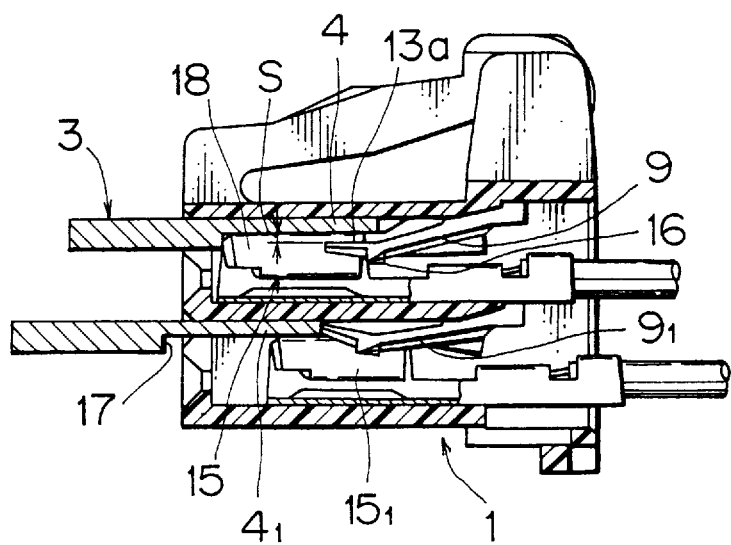
FIG. 4 is a longitudinal cross-sectional view showing a connector undergoing inspection.

The guide groove 5 extends along the straight portion 13 to slightly exceed a boundary between the straight portion 13 and a supporting piece inclined portion 14. Referring to FIG. 3, the straight surface 13a of the straight portion 13 is situated in the lower side so as to intervene with a few of the clearances on the bottom surface 5c of the guide groove 5. In other words, the straight portion 13 is a small distance apart from the guide groove 5 in a direction toward the direction opposite of which the resilient supporting piece bends into. As shown in FIG. 4, an engaging projection 16 to a female terminal 15 is formed in the vicinity of the boundary between the straight portion 13 and the supporting piece inclined portion 14 at the lower side of the straight portion 13.

As shown in FIG. 4, the incomplete insertion detecting finger 4 for the detecting pin 3 is inserted straight into the connector housing along the track of the guide groove 5. A step portion of the detecting pin 3, namely, a continuity detecting portion 17, is inserted in the vicinity of the communicating space 8, which is lower than the guide groove 5. The incomplete insertion detecting finger 4 is situated in the upper side so as to intervene with a few of the clearances of the resilient supporting piece 9 for the female terminal, which has been completely inserted. The resilient supporting piece 9 causes the engaging projection 16 to engage the rear step portion of the electric contacting portion 18, with the straight surface 13a of the resilient supporting piece 9, rather than the lower side of the upper surface of the electric contacting portion 18 of the female terminal 15. In the first embodiment, since the incomplete insertion detecting finger 4 is made of insulating material, there is no risk of an electrical short from the contact with the terminal 15. When the incomplete insertion detecting finger 4 is made of conductive metal, a space should be provided between the terminal 15 and the incomplete insertion detecting finger 4 so as to prevent the two from contacting each other.

The continuity detecting portion 17 comes into contact with the tip of the electric contacting portion 18. A permanent set in fatigue, toward the bending direction of the resilient supporting piece 9, is absorbed by virtue of the space S. Thus, interference is prevented between the detecting pin 3 and the resilient supporting piece 9. Similarly to the above-described prior art, a terminal 15$_1$ is incompletely inserted. Referring to FIG. 3, a resilient supporting piece 9$_1$, which corresponds to the terminal 15$_1$, is situated in the bending space 19, when the resilient supporting piece 9$_1$ is bent. The incomplete insertion detecting finger 4$_1$ comes into contact with the tip of the resilient supporting piece 9$_1$, as a result of a continuity inspection. Since the incomplete insertion detecting finger 4$_1$ becomes non-conductive, an incomplete insertion of a terminal 15$_1$ is detected.

In the continuity inspection, even in the case where the connector 1 is set at an oblique angle, the incomplete insertion detecting finger 4 of the inspecting pin 3 is guided to the pick-up surface 7 of the guide groove 5. At the same time, the detecting pin 3, which has some amount of degrees of freedom of movement, is capable of being inclined either sideways or up-and-down. Either the detecting pin 3 is smoothly inserted into the guide groove 5, or the connector 1 is correctly placed in a normal position, so that neither interference between the incomplete insertion detecting finger 4 and the resilient supporting piece 9, nor a scoring of the resilient supporting piece 9 caused by the incomplete insertion detecting finger 4, will occur. Accordingly, sure and certain detection will be provided.

Figure 5:
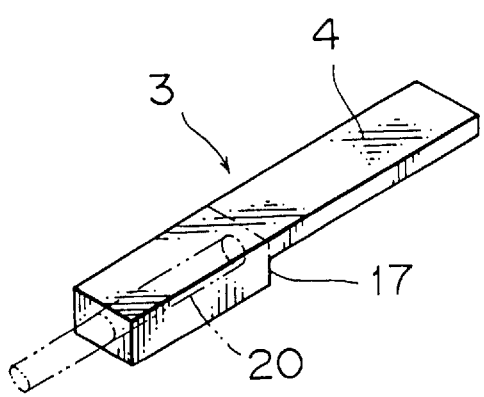
FIG. 5 is a perspective view showing an example of an inspection pin.

FIG. 5 shows one example of an inspecting pin for using to the above-described male connector 1. The incomplete insertion detecting finger 4 is made of insulating material so as to prevent an electric short circuit of the female terminal 15. A detecting piece, which projects from the incomplete insertion detecting finger 4, namely, a continuity detecting portion, is made of a conductive material. Maybe, as disclosed in Japanese Patent Application No. HEI 6-316423, it is good construction because a conductive shaft portion 20 is caused to be inserted into the detecting piece 17 with electric non-conductance, as shown by the chain line. Further, when the incomplete insertion detecting finger 4 is caused to be integrally formed with the continuity detecting portion 17 by conductive metal, an insulative treatment is applied to a surface of the incomplete insertion detecting finger 4.

Figure 6:
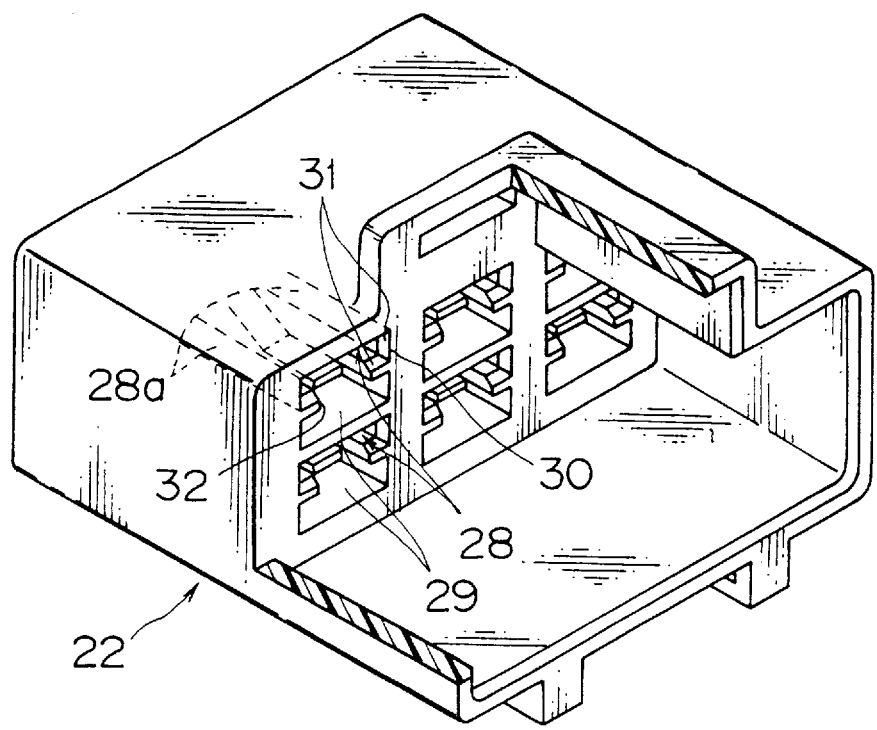
FIG. 6 is a perspective view showing a female connector housing as the second embodiment according to the present invention.
Figure 7:
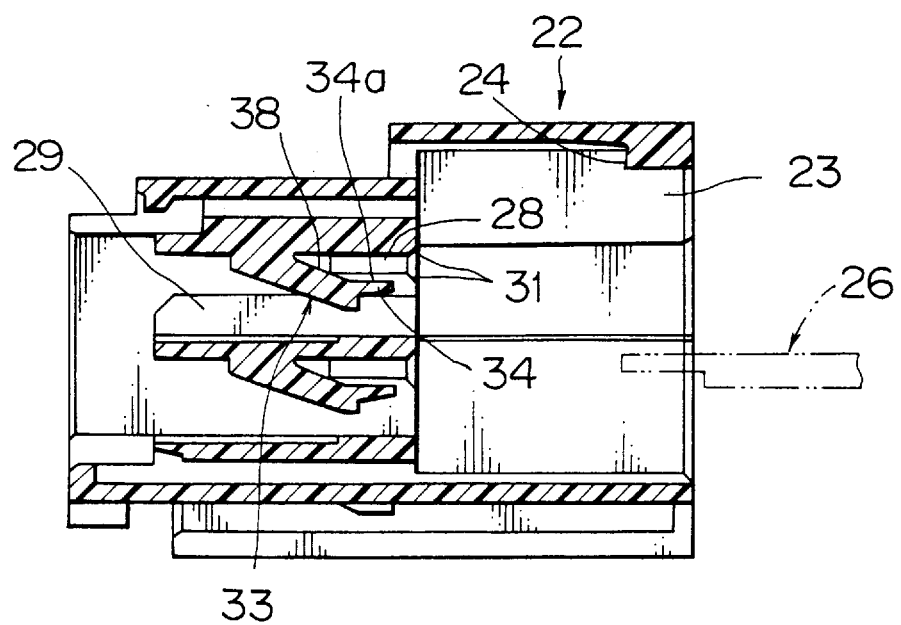
FIG. 7 is a longitudinal cross-sectional view of FIG. 6.
Figure 8:
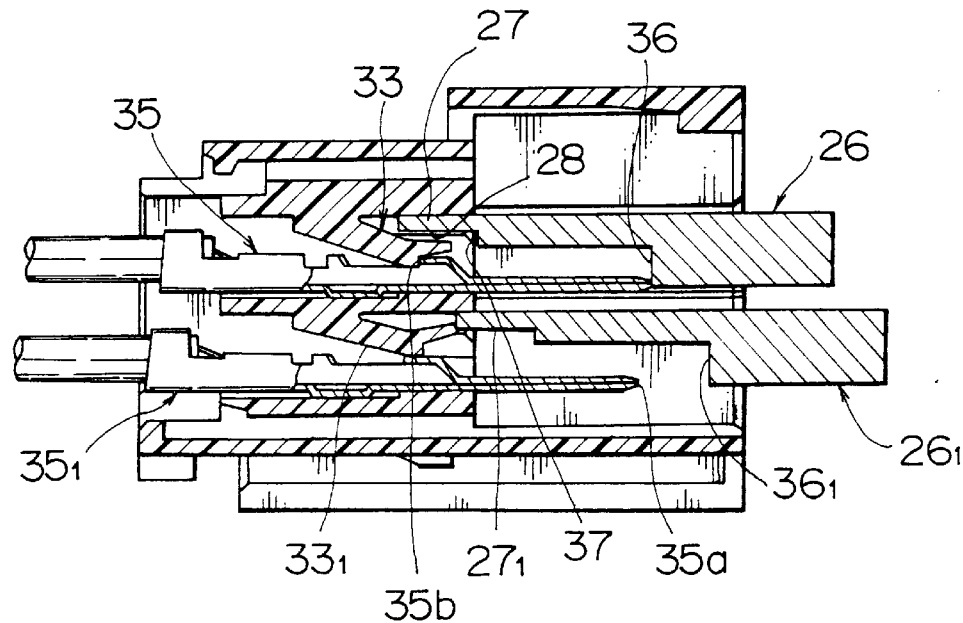
FIG. 8 is a longitudinal cross-sectional view showing a connector undergoing inspection.
Figure 10:
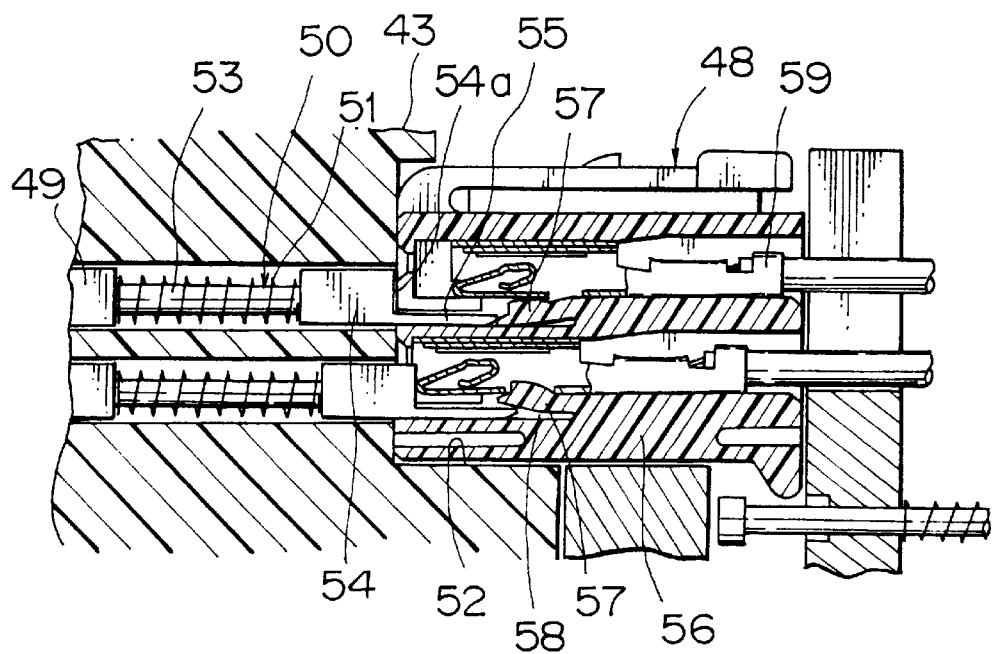
FIG. 10 is a longitudinal cross-sectional view showing a connector undergoing conventional inspection.
Figure 9:
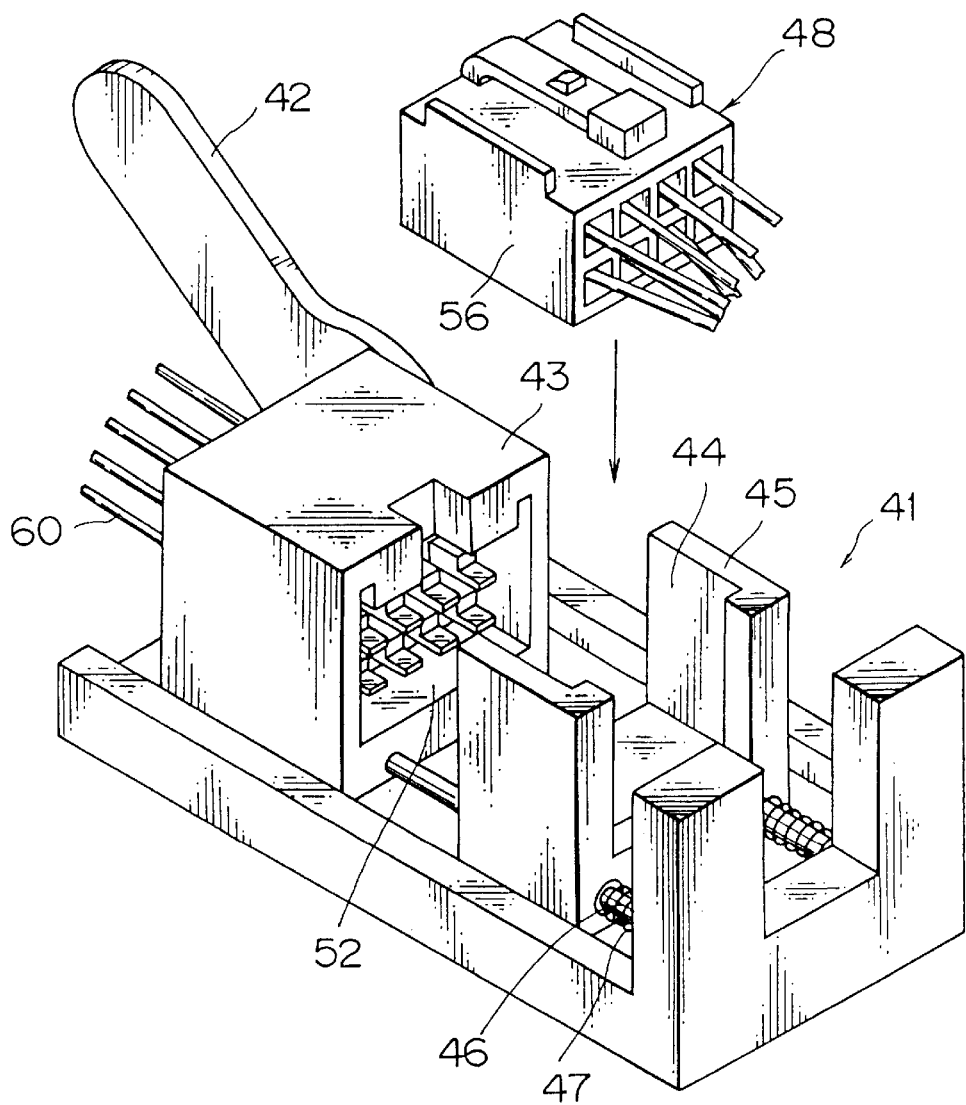
FIG. 9 is a perspective view showing a connector being inserted into a checking device.
Figure 11:
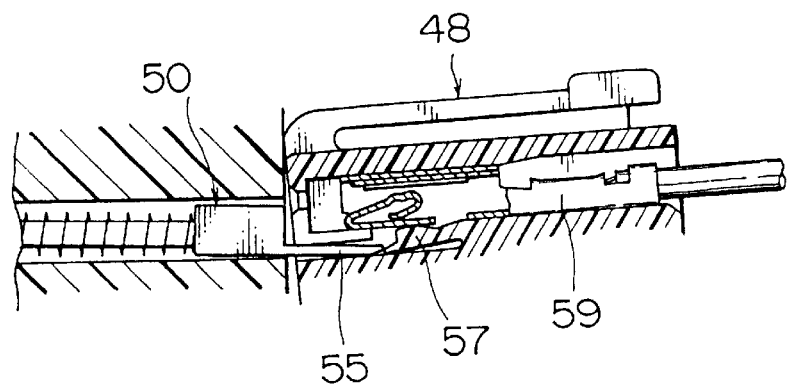
FIG. 11 is a longitudinal cross-sectional view showing a principal portion of the connector undergoing conventional problems.

FIGS. 6 to 8 shown a second embodiment of the present invention, wherein a female connector 21 acts as a continuity inspecting connector.

The female connector housing 22 is made of synthetic resin and has a connecting chamber 23 corresponding to the male connector housing 2 (referring to FIG. 1). The female connector housing 22 also has an engaging portion 24, corresponding to a lock arm 25 (referring to FIG. 1), at the first half portion thereof, a guide groove 28, corresponding to an incomplete insertion detecting finger 27 of an inspecting pin 26, and a terminal receiving chamber 29, in communication with the guide groove 28, at the latter portion thereof.

The guide groove 28, which has a rectangular-shaped opening portion 30, extends straight backwardly similar to the above-described example, and a pick-up surface 31 for guiding an inspecting pin, is formed at the opening portion 30. A pair of protuberances are formed to extend from the opening end to an intermediate portion in the longitudinal direction of the terminal receiving chamber 29 at the lower side of a pair of concave grooves 28a. The concave grooves 28a are formed on the right- and left-hand sides of the guide groove 28, as shown in FIG. 6. The guide groove 28 and the terminal receiving chamber 29 are separated, at the lower side of the guide groove 28, by the protuberance 32. Furthermore, referring to FIG. 7, the resilient supporting piece 33 in the female connector housing 2 has a straight portion 34 (straight surface 34a) parallel to the guide groove 28, which is a small distance apart downwardly thereof at the pointed end direction.

The guide groove 28 is formed to extend, so as to exceed the straight portion 34, to a supporting piece inclined portion 38. For the structural reason of receiving the male terminal 35 into the connector housing 2, the guide groove 28 is formed shorter in length than the guide groove 5 of the male connector housing 2 (referring to FIG. 3). However, since the straight portion 34 is long and is formed so as to protrude at the tip of the resilient supporting piece 33, a stroke distance of the inspecting pin 26 is established to be longer than the conventional one of the connector. As shown in FIG. 8, the tip of the resilient supporting piece $33_1$ will come into contact with the incomplete insertion detecting finger $27_1$ in the condition that there is a sufficiently long distance between the continuity detecting portion $36_1$ of the inspecting pin $26_1$ and the tip tab portion 35a of the terminal $35_1$. Thus, the inspection is capable of extraordinary precision because of the prevention of the occurrence of a detecting error.

An intermediate concave portion 35b of a tip tab portion 35a of the male terminal 35, which is engaged with the resilient supporting piece 33, protrudes into the connecting chamber 23. A continuity detecting portion 36 of the conductive inspecting pin 26 comes into contact with the tip tab portion 35a. The inspecting pin 26, which is formed integrally with conductive material, includes an incomplete insertion detecting finger 27, which is capable of being inserted into the guide groove 28, an intermediate step portion 37, corresponding to the opening portion 30 of the guide groove 28 in the projected base portion of the incomplete insertion detecting finger 27, and a step portion as the continuity detecting portion for the tip tab portion 35a. Further, the inspecting pin 27 may be such that only the continuity detecting portion 36 is made of a conductive material and the other components are made of an insulating material.

It will be appreciated from the foregoing description that, according to the present invention, since the incomplete insertion detecting finger of the inspecting pin is inserted straight into the connector housing along the track of the guide groove, even if when the connector is placed in the inspection tool with the connector being in an inclined state, accurate inspection of both incomplete insertion and continuity detection can be accomplished, without causing the resilient supporting piece of the connector housing to bend or to be damaged by scoring.

Further, since the straight portion is formed so as to protrude at the tip direction of the resilient supporting piece, when the incomplete insertion detecting finger comes into contact with the straight portion at the time when the terminal is inserted incompletely, there is a sufficiently long distance between the continuity detecting portion of the inspecting pin and the terminal. Accordingly, a detection error for continuity can be prevented and as a result, an accurate inspection can be performed.

Furthermore, by virtue of the structure in which the straight portion is a small distance apart from the guide groove in a direction toward the direction opposite to direction in which the resilient supporting piece is capable of bending, the tip of the resilient supporting piece is prevented from miscontacting the incomplete insertion detecting finger, wherein the incomplete insertion detecting finger is associated with a permanent set in fatigue of the resilient supporting piece. Accordingly, it becomes possible to inspect more accurately.

While preferred embodiments of the invention have been described using specific terms, such description is for illustration only, and it is to be understood that changes and variations may be made without departing from the spirit or scope of the following claims.

What is claimed is:

1. A connector for detecting incomplete insertion of a terminal comprising:

a connector housing having at least one terminal receiving chamber for said terminal;

at least one resilient supporting piece extending into said at least one terminal receiving chamber of said connector housing;

at least one guide groove for insertion of an incomplete insertion detecting finger of an inspecting pin to detect incomplete insertion of said terminal, wherein said at least one guide groove is formed as a part of a resilient supporting piece bending space along a wall of said connector housing so that said at least one resilient supporting piece is capable of bending upwardly into said at least one guide groove in order to confront an end of said incomplete insertion detecting finger of said inspecting pin which has been inserted into said at least one guide groove of said at least one terminal receiving chamber of said connector housing;

at least one space provided between a bottom of said at least one guide groove and a top surface of a tip end of said at least one resilient supporting piece; and at least one pick up surface for guiding said incomplete insertion detecting finger formed at an opening of said guide groove, wherein said at least one pick up surface is tapered inwardly towards said at least one terminal receiving chamber in a direction of insertion of said inspecting pin into said at least one guide groove.

2. The connector for detecting incomplete insertion of a terminal according to claim 1, wherein said at least one guide groove is provided for a construction in which said inspecting pin has a continuity detecting portion at a base side of said incomplete insertion detecting finger which is inserted into said bending space where said tip end of said at least one resilient supporting piece is capable of being bent into, at the same time, said continuity detecting portion comes into contact with said terminal of said at least one terminal receiving chamber.

3. The connector for detecting incomplete insertion of a terminal according to claim 1, wherein said tip end of said at least one resilient supporting piece has a straight portion along said at least one guide groove formed protrusively with said straight portion lengthened at said tip end of said at least one resilient supporting piece.

4. The connector for detecting incomplete insertion of a terminal according to claim 2, wherein said tip end of said at least one resilient supporting piece has a straight portion along said at least one guide groove formed protrusively with said straight portion lengthened at said tip end of said at least one resilient supporting piece.

\* \* \* \* \*